United States Patent [19]
Keirn et al.

[11] Patent Number: 5,696,451

[45] Date of Patent: *Dec. 9, 1997

[54] IDENTIFICATION OF PIN-OPEN FAULTS BY CAPACITIVE COUPLING

[75] Inventors: Kevin W. Keirn; David T. Crook, both of Loveland, Colo.

[73] Assignee: Hewlett-Packard Co., Palo Alto, Calif.

[*] Notice: The term of this patent shall not extend beyond the expiration date of Pat. No. 5,124,660.

[21] Appl. No.: 848,909

[22] Filed: Mar. 10, 1992

[51] Int. Cl.$^6$ ............................................. G01R 27/26
[52] U.S. Cl. ............................ 324/687; 324/537; 324/679
[58] Field of Search ............................ 324/537, 765, 324/676, 679, 686, 687

[56] References Cited

U.S. PATENT DOCUMENTS

| | | | |
|---|---|---|---|
| 4,779,041 | 10/1988 | Williamson, Jr. | 324/73 |
| 4,789,829 | 12/1988 | Stribling | 324/263 |
| 4,918,376 | 4/1990 | Poduje, et al. | 324/663 |
| 5,124,660 | 6/1992 | Cilingiroglu | 324/538 |
| 5,254,953 | 10/1993 | Crook et al. | 324/538 |
| 5,266,901 | 11/1993 | Woo | 324/537 |
| 5,557,209 | 9/1996 | Crook et al. | 324/537 |

FOREIGN PATENT DOCUMENTS

| | | | |
|---|---|---|---|
| 0177210 | 4/1986 | European Pat. Off. | |
| 2143954 | 2/1985 | United Kingdom. | |
| 2179751 | 3/1987 | United Kingdom | G01R 31/04 |

*Primary Examiner*—Glenn W. Brown

[57] ABSTRACT

Disclosed is a system that determines whether input and output pins of semiconductor components are present and properly soldered to a circuit assembly. The system includes an oscillator which is connected to a probe that is brought into contact with a circuit assembly wiring trace soldered to the pin being tested. A conductive electrode is placed on top of the component and connected to a capacitance measuring circuit. The oscillator signal is capacitively coupled through the integrated circuit package to the pin being tested, so if capacitance is measured by the capacitance measuring device, the pin is connected to the circuit assembly. An amplifier may be connected to the conductive electrode to amplify the signal, and a segmented probe may be used to isolate individual pins. The probe may be shielded, and unused pins may be grounded.

25 Claims, 7 Drawing Sheets

IDENTIFICATION OF PIN-OPEN FAULTS BY CAPACITIVE COUPLING

CROSS REFERENCE TO RELATED APPLICATIONS

This application is related to application Ser. No. 07/631,609 filed Dec. 12, 1990, now U.S. Pat. No. 5,124,660, entitled Identification of Pin-Open Faults by Capacitive Coupling through the Integrated Circuit of Ugur Cilingiroglu, which is owned by the same entity.

FIELD OF THE INVENTION

This invention relates to measuring and testing devices and more particularly to in-circuit testing devices. Even more particularly, the invention relates to in-circuit testing of connections between an integrated circuit and a printed circuit board.

BACKGROUND OF THE INVENTION

It is important that electronic components and printed circuit boards be tested after the components have been soldered to the printed circuit boards. Several different approaches have been developed for testing the components and printed circuit boards, including functional testing, in-circuit testing, and manufacturing defect analyzers.

Functional testing uses a procedure of applying predetermined input signals and monitoring the output of a printed circuit board to determine if all of the components are present and operating properly on the circuit board. While functional testing provides a way of determining whether the P.C. board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components.

Because of the limitations of functional testing, in-circuit testing techniques have been used to individually test the components on the printed circuit board to determine if these components are working properly. This process uses a "bed of nails" tester to access each individual component and test that component individually. In this manner, non-functioning components can be identified and replaced to prevent the entire circuit board from being scrapped. This process works well for simple components where the circuit inside the component is known and can be easily tested. If the component being tested is very complex, or if the circuit inside the component is unknown, in-circuit testing may not achieve satisfactory results.

Manufacturing defect analyzers are another class of testing devices that provide simpler tests and are less expensive to implement. These devices are designed to locate manufacturing faults, such as shorts on a printed circuit board, missing integrated circuits, bent component pins, etc. Although these devices do a reasonably good job of finding shorts and gross analog faults, they are marginal when testing digital sections of the board.

One very important potential problem that must be tested on every printed circuit board is whether all the pins of every component are soldered to the circuit board. Functional testing may miss a particular pin, if the functions performed by that particular pin are not thoroughly tested in functional test. Testing for this type of fault is particularly difficult when the circuit inside the component is unknown, such as the case with application specific integrated circuits (ASICs). Because of the large number of ASICs and the complexity of these devices, it is often not feasible to design an in-circuit test or a functional test to isolate this particular component.

There is need in the art then for a device and method which will determine whether all pins of a component are soldered to a circuit board. There is further need in the art for such a device and method which does not rely on the circuit contained in the component. The present invention meets these and other needs.

This application is related to application Ser. No. 07/631,609 filed Dec. 12, 1990, now U.S. Pat. No. 5,124,660, entitled Identification of Pin-Open Faults by Capacitive Coupling through the Integrated Circuit of Ugur Cilingiroglu, which is incorporated herein by reference for all that is disclosed therein.

SUMMARY OF THE INVENTION

It is an aspect of the present invention to provide an apparatus and method to test for a connection between a pin of a component and a circuit assembly to which it is attached.

It is another aspect of the invention to provide such an apparatus and method that does not rely on the circuit contained inside the component.

The above and other aspects of the present invention are accomplished in a system that overcomes the disadvantages and limitations of the prior art by providing an apparatus and method for determining whether analog, digital, discrete or non-electrical components are present and properly connected to a printed circuit board. The present invention determines whether terminal pins, including input, output, power and ground, are connected to the circuit assembly regardless of the component family being used.

Specifically, the invention uses a metallic probe, such as copper plate, placed on top of an integrated circuit package. A connection is then made, through a bed of nails tester or other means, to a circuit assembly wiring trace that connects to the pin being tested. This connection is in turn connected to an oscillator, and an output of the probe is connected to a measuring device. The oscillator is then set to supply a signal to the pin, and this signal is capacitively coupled through the component package to the probe. Current is measured flowing out of the probe onto the measuring device, and if this current exceeds a predetermined threshold, the pin is considered to be connected. This system may also include an amplifier between the probe and the measurement device to reduce sensitivity to noise, and eliminate any unwanted system capacitance.

An alternative embodiment measures the capacitance between the metallic probe and the lead within the integrated circuit, and if the capacitance exceeds the base capacitance of the system by a predetermined amount, the pin is considered connected. The system may also measure voltage between the probe and pin to determine capacitance. Where multiple pins are tied together inside the integrated circuit, the capacitance of all the pins is compared against a threshold capacitance. Unused pins may be grounded to minimize their affect on the capacitance. The probe may be shielded to minimize stray capacitance. A segmented probe, which has a separate segment over each pin of the integrated circuit may be used to further isolate a single pin.

In another alternative embodiment the voltage or current source to connected to the probe and the measuring system is connected to the pin.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
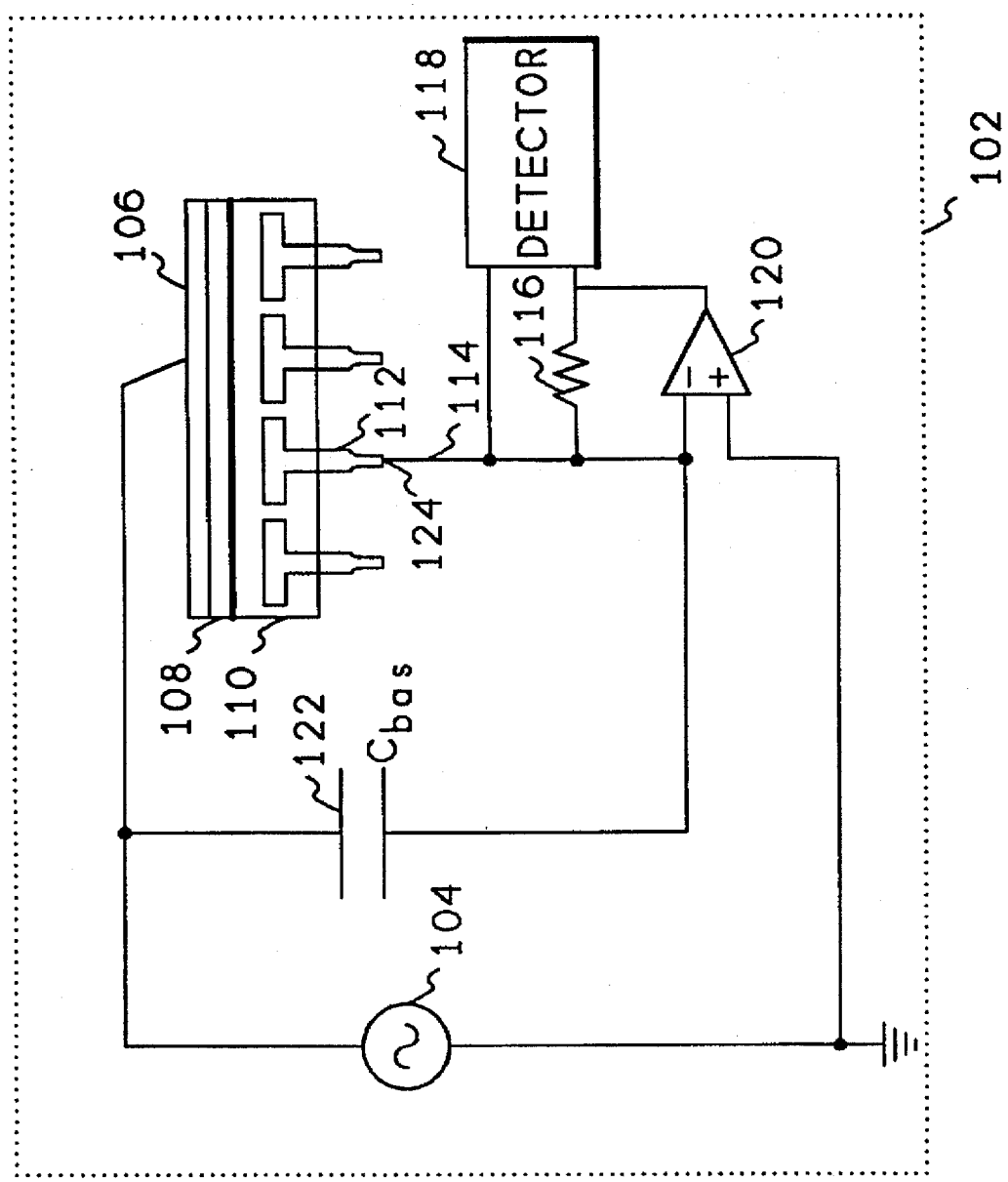
FIG. 1 shows a schematic diagram of the invention.

FIG. 1 shows a schematic diagram of an alternative embodiment the invention. The preferred embodiment will be described below with respect to FIGS. 7 and 10. Referring now to FIG. 1, the system of one embodiment of the present invention 102 uses an oscillator 104 which supplies an alternating current signal, typically eight kilohertz (8 KHz) at three (3) volts. The output of the oscillator 104 is connected to a metallic electrode 106 which is placed on top of an integrated circuit package 110. An insulator 108 may be placed between the electrode 106 and the integrated circuit package 110. A terminal pin under test 112 is connected to an integrated circuit trace 114 which is connected to a current measuring circuit. The connection to the current measuring circuit is typically made through a bed of nails connecting device.

The current measuring circuit has an operational amplifier 120 with a feedback resistor 116. A detector 118, typically a voltmeter, is connected across the resistor 116 to measure the voltage drop, and thus the current flowing through the resistor 116. The current flowing through the resistor 116 is proportional to the current flowing through trace 114. The current measured must be greater than the amount of current that would flow through the baseline capacitance of the measurement system, represented by capacitor $C_{bas}$ 122.

The current measuring circuit also determines the amount of capacitance that exists between the probe and the pin. As is well known in the art, since the frequency of the oscillator 104 is known, the capacitance can be calculated directly from the amount of current flowing in board trace 114. The capacitance between the probe and the pin is the calculated capacitance less the amount of capacitance in baseline capacitor 122.

To perform the test, the oscillator 104 is activated and a current is conducted to the electrode 106. Through capacitive coupling, the current is passed to the pin 112 of the integrated circuit 110. The current then passes through a connection to a circuit assembly trace 114 and the current then passes to the circuit 116, 118 and 120 which measures the amount of current flowing from the pin 112 by measuring the voltage across resistor 116. If a threshold amount of current is measured by the circuit, that is, the current measured is greater than the amount of current flowing through $C_{bas}$ 122 alone, then the pin 112 must be connected to the integrated circuit trace 114. If the pin 112 is not connected at location 124, no current will be conducted to the integrated circuit trace 114 and the threshold amount of current will not be measured by the circuit, indicating that a pin open fault is present. The detector 118 provides an indication to an operator of the system that the pin is or is not connected.

In an alternative embodiment (not shown), a voltage measurement circuit is connected between the probe 106 and the circuit trace 114 to measure the voltage across the capacitor formed by the probe and the pin. This measured voltage is used to calculate the capacitance formed and if the capacitance is equal to $C_{bas}$ alone, then a fault is present.

Figure 2:
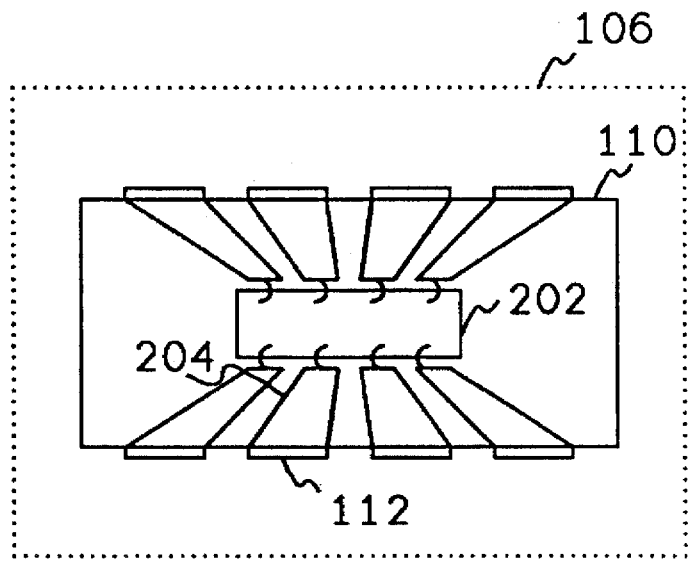
FIG. 2 shows a top cutaway view of an integrated circuit.
Figure 3:
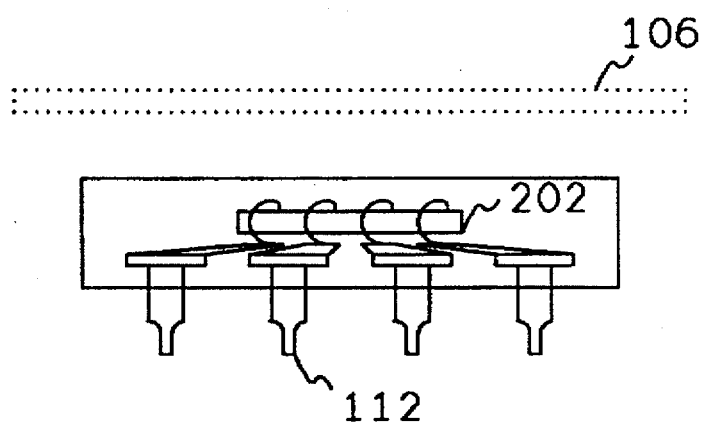
FIG. 3 shows a side cutaway view of an integrated circuit and illustrates, along with FIG. 2, how the capacitive coupling occurs.

FIG. 2 shows a top cut away view of the integrated circuit 110 and the electrode 106, and FIG. 3 shows a side cut away view of the integrated circuit 110 and the electrode 106. FIGS. 2 and 3 illustrate how the capacitive coupling occurs between the electrode and the pins of the integrated circuit. Referring now to FIGS. 2 and 3, the integrated circuit package 110 contains an integrated circuit 202. The integrated circuit 202 contains connections, however, these connections must be made to the outside of the integrated circuit package 110. Therefore, the pin 112 is connected to an internal conductor 204 which connects the pin 112 to a location just adjacent the integrated circuit 202. There a small wire spans between the conductor 204 and a location on the integrated circuit 202. Similar connections are made to all the other pins of the integrated circuit package 110.

The conductor 204 forms a conductive plate, which acts as one plate of a capacitor. The other plate of the capacitor is the electrode 106, here illustrated by dashed lines, indicating that the conductor 106 is placed over the top of the integrated circuit package 110. Although the capacitor created in this manner is small, it is sufficient to conduct a signal from the electrode 106 to the pin 112.

Figure 4:
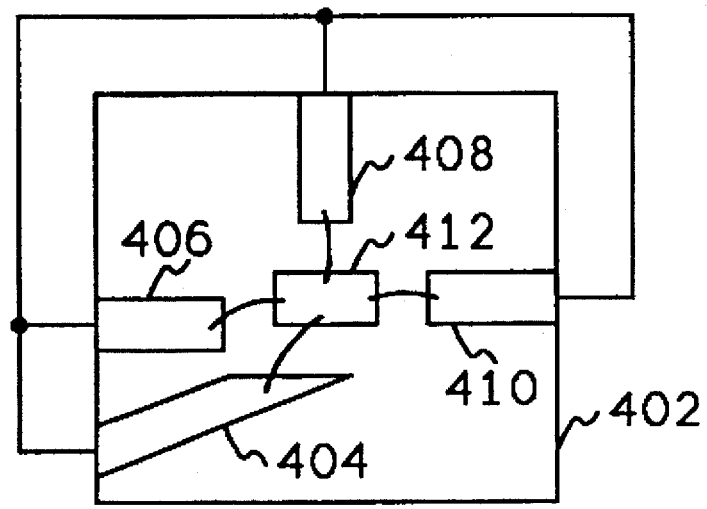
FIG. 4 shows an integrated circuit having several pins connected externally outside the integrated circuit.

Occasionally, multiple pins within an integrated circuit will be tied together. For example, this often occurs if an integrated circuit has multiple ground pins or multiple pins for a particular signal. FIG. 4 shows a diagram of an integrated circuit having four pins tied together. Referring now to FIG. 4, an integrated circuit 402 contains four leads within the package that are tied together. Lead 404, lead 406, lead 408, and lead 410 are all connected to a common point 412 within the integrated circuit 402. This presents a testing problem, since it is difficult to detect when one or some, but not all, of the pins connected to the leads 404, 406, 408, and 410 are not making contact with the circuit assembly. By using the circuit of FIG. 1 to measure the amount of capacitance between a probe and a lead, multiple leads tied together can be analyzed.

Initially, the amount of capacitance between the four pins of the integrated circuit 402 and a probe would be measured using a circuit that is known to be functioning correctly. This amount of capacitance will have a particular value, for example, 200 femtofarads. The pins of the integrated circuit 402 are then intentionally disconnected, one at a time, and the amount of capacitance measured again. Using this method, the amount of capacitance of each pin can be determined. For example, the capacitance might be measured as follows:

pin 404–65 femtofarads
pin 406–45 femtofarads
pin 408–45 femtofarads
pin 410–45 femtofarads When an unknown circuit is tested, if any one pin is not connected, the capacitance will be less than the amount measured for all four pins, indicating a fault. In addition, if pin 404 is not making contact, the capacitance will be a unique value, because of the unique amount of capacitance created by pin 404. Thus, in some cases, the difference in the capacitance will allow the technique to determine exactly which pin is not making contact.

In the above example, if pin 404 is not making contact, the measured capacitance would be 135 femtofarads, indicating that only pin 404 could be responsible for the decreased capacitance. This technique, however, is ineffective if the pins are connected to the device substrate through a low impedance path. In this case, all the pins must be unconnected before the technique can detect a lowered capacitance.

Figure 5:
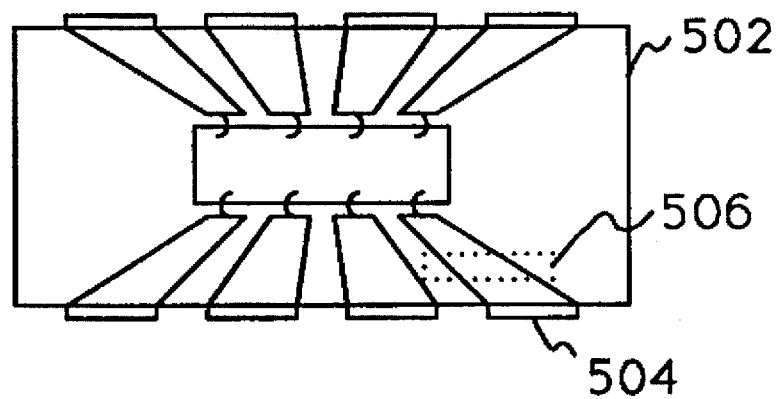
FIG. 5 shows the use of a very small probe that can be placed over a single pin of an integrated circuit.

Another method will also solve the problem depicted by FIG. 4. That method is the use of a very small probe which covers only the surface area of a single pin. FIG. 5 shows a diagram of such a probe placed over an integrated circuit. Referring now to FIG. 5, an integrated circuit 502 has a pin 504 with a very small probe 506 placed over top of the pin 504. By moving the smaller probe 506 around the top of the integrated circuit 502, each pin can be probed separately. This technique results in much smaller capacitance being measured, however. For example, in one test of this technique, connected pins measured a capacitance of approximately 50 femtofarads, whereas unconnected pins measured 15 femtofarads.

Figure 6:
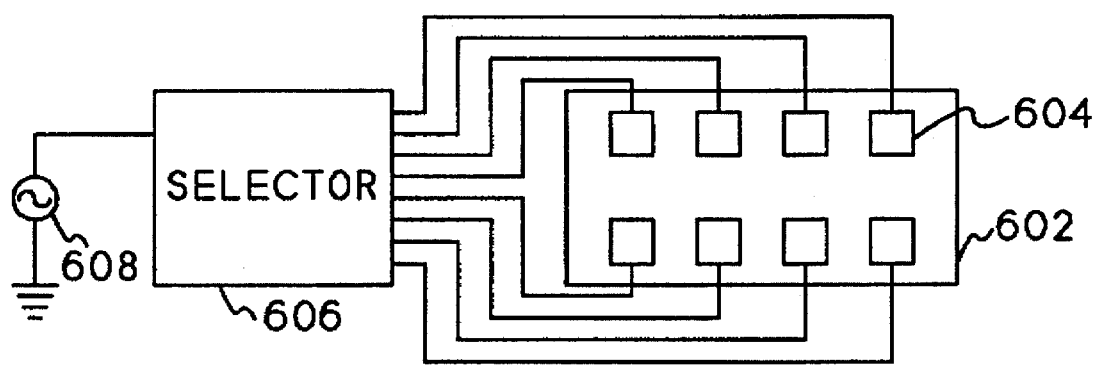
FIG. 6 shows a segmented probe that is used to separately test each pin of an integrated circuit.

The technique of FIG. 5 can be extended by creating a segmented probe as shown in FIG. 6. Referring now to FIG. 6, a probe 602 has a number of very small segments, such as segment 604, each of which will be located over a single pin when the probe 602 is placed on top of an integrated circuit. Each of the segments is connected to one output of a selector 606, to select a single segment when testing, and the input to the selector is connected to the voltage source 608. When using the segmented probe 602, the measuring device is connected in the same manner as FIG. 1.

In the circuit of FIG. 1, a fairly large signal, typically three volts, is applied to the probe placed on top of the integrated circuit. This is generally not the preferred way of testing a pin because of the large voltage that can be used. However, if the pin being tested is also connected to a pull-up resistor, or any resistor tied to a node which may be grounded, a reversal of the source and detector in the circuit of FIG. 1 may be desirable.

Figure 7:
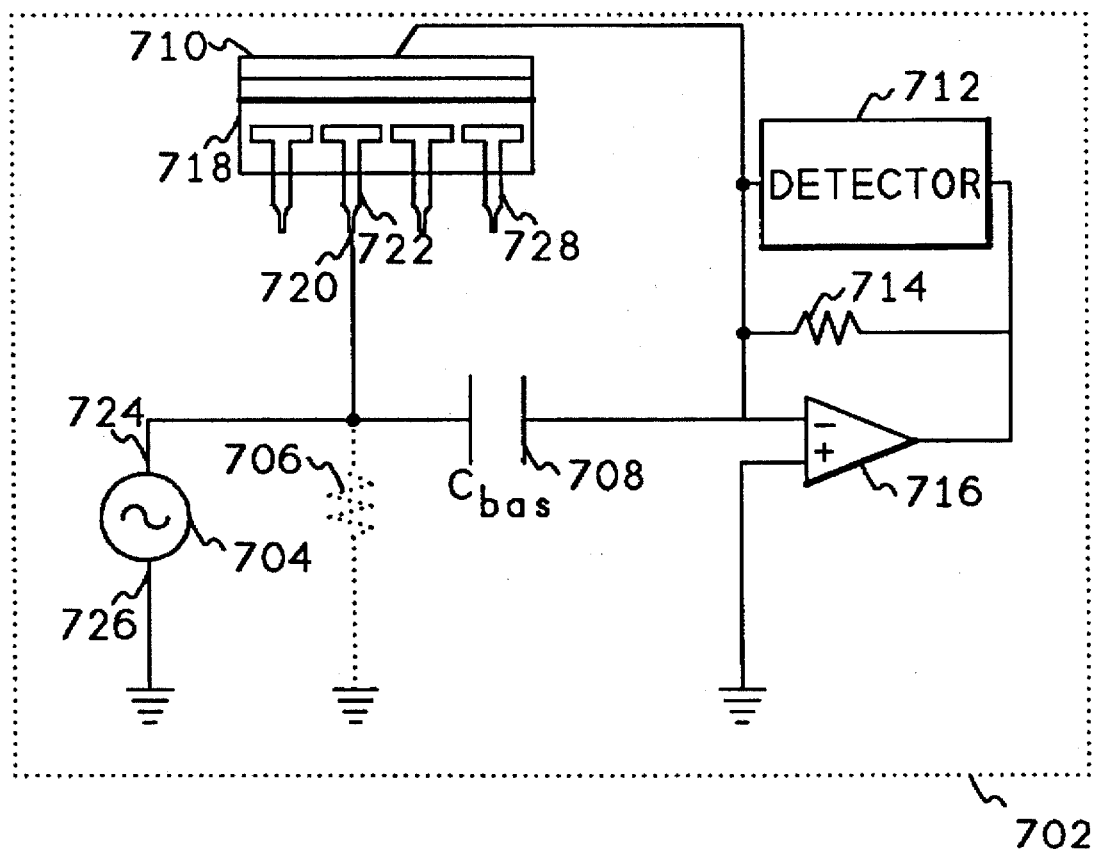
FIG. 7 shows a schematic diagram of the preferred embodiment of the invention wherein the component connections reversed from FIG. 1.

A circuit implementing this reversal is shown in FIG. 7, which is the preferred embodiment. Referring now to FIG. 7, a source 704, which is typically 0.2 volts RMS, is connected to the integrated circuit pin which forms one plate of the probe capacitor 710. Resistor 706 represents the pull-up resistor that may be inside or outside inside the integrated circuit 718. The baseline system capacitance 708 is always in parallel with the capacitor formed by the probe 710 and the terminal pin 720. These two capacitors are connected to the measurement circuit which includes the op-amp 716, feedback resistor 714, and detector 712. Because of the low voltage of the source 704, that is, approximately 0.2 volts RMS, junction diodes within the integrated circuit being tested are not forward biased enough to overload the source.

Figure 8:
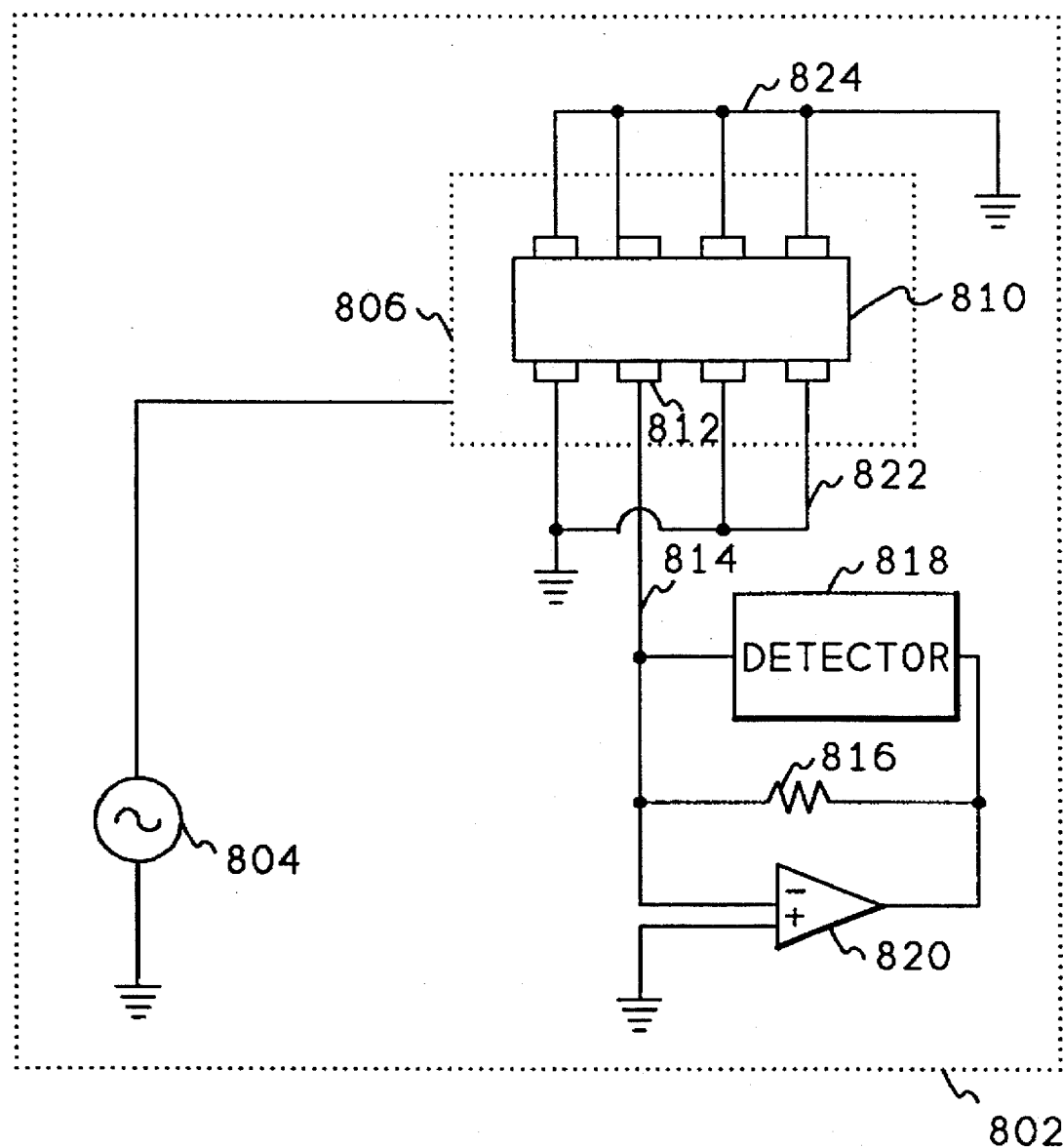
FIG. 8 shows a schematic diagram of the invention with unused pins grounded.

FIG. 8 shows a schematic diagram of the circuit of FIG. 1 with the addition of pin guarding. Referring now to FIG. 8, the test circuit 802 contains a signal source 804 which is connected to a probe 806, placed over an integrated circuit 810. Signal capacitively coupled from the probe 806 to a pin 812 is conducted through a conductor 814 to a current measuring circuit which includes an op-amp 820, a feedback resistor 816, and a detector 818. In the circuit of FIG. 8, unlike the circuit of FIG. 1, all the pins of integrated circuit 810 that are not being tested, are grounded through ground connections 822 and 824. This grounding of unused pins is called "guarding". The guarding illustrated in FIG. 8 prevents cross-talk between the pin being tested and other pins on the integrated circuit, thus, reducing any stray capacitive coupling between pins and providing a better indication when a pin is not connected. This technique is particularly effective when one of the grounded pins is also connected to a ground plane of the printed circuit board containing the component, since this places a large grounded plane underneath the entire integrated circuit and adjacent circuits.

Figure 9:
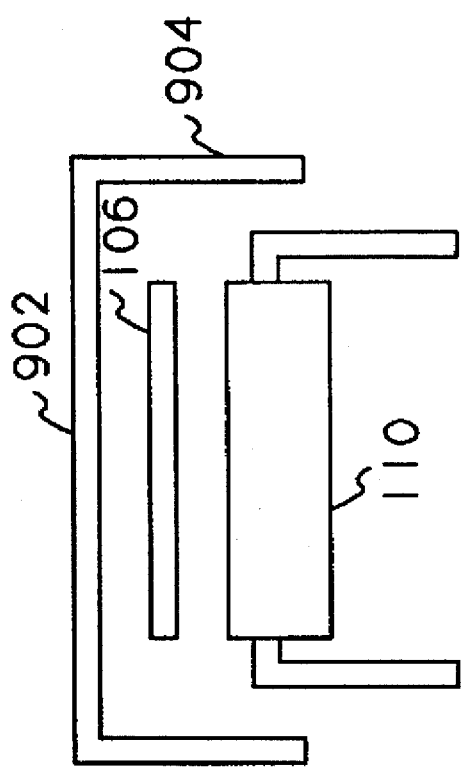
FIG. 9 shows a diagram of the probe with a shield.

Another technique for reducing cross-talk and noise is to place a grounded shield over the probe. FIG. 9 shows a diagram of such a shield in place over the probe. Referring now to FIG. 9, an integrated circuit 110 contains the capacitive probe 106 as illustrated previously in FIG. 1. In addition, however, a shield 902 is placed over the probe 106 but not contacting the probe 106. The shield 902 also contains a skirt 904 which extends outside the probe 106 and down over a part of the pins of the integrated circuit 110.

The probe 106 (FIG. 1) may also placed in contact with any heat sink which is located on top of the integrated circuit 110. If the heat sink is not grounded, the probe may contact or couple to the heat sink, which enhances the coupling between the probe and the lead frame. However, if the heat sink is grounded, the leads within the integrated circuit will effectively be shielded from the capacitive probe and no capacitance can be measured. In these situations, the integrated circuit must be tested prior to grounding the heat sink.

Figure 10:
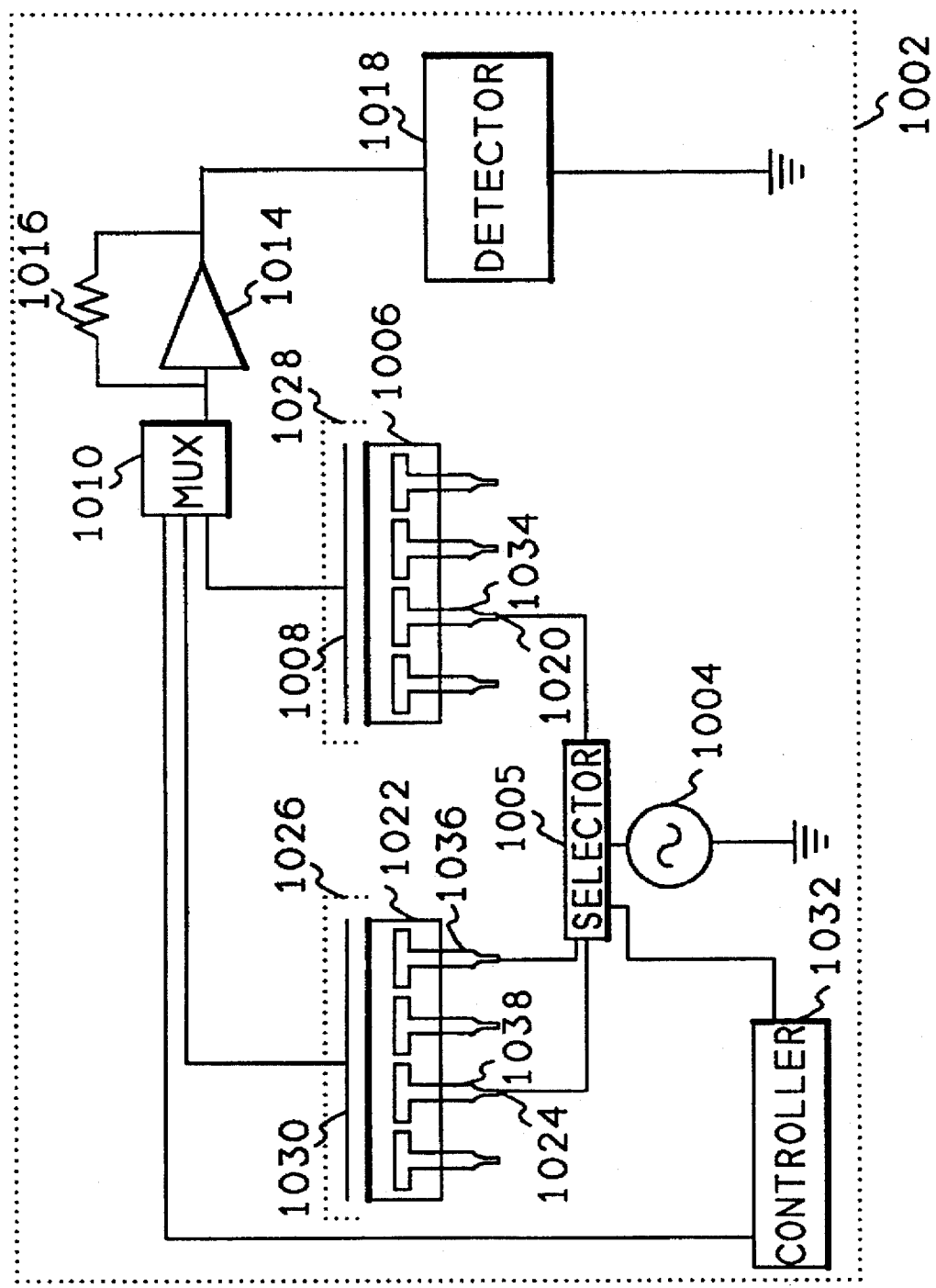
FIG. 10 shows a schematic diagram having the measurement system connected to the probe.

FIG. 10 shows an alternative embodiment having the measurement system connected to the probe, as in FIG. 7, but also including an amplifier in the probe circuit. Referring now to FIG. 10, a source 1004, which is typically 0.2 volts RMS, is connected to a selector 1005, and an output of the selector 1005 is connected to a pin 1020 of an integrated circuit 1006. The probe 1008 is placed adjacent the integrated circuit 1006 and is connected to a multiplexer 1010. The output of the multiplexer 1010 is connected to an amplifier 1014 having a large feedback resistor 1016. The multiplexer could be controlled by a switch or it could be controlled electrically by a controller or computer system. The output of the amplifier 1014 is connected to a detector 1018 to measure the current or voltage across the capacitance formed by the probe 1008 and the pin 1020. A shield 1028 may also be placed over the integrated circuit 1006 in the manner described above with respect to FIG. 9. The amplifier 1014 may also be placed inside the shield 1028.

A second integrated circuit 1022 can also be tested. The source 1004 is also connected to pin 1024 of the integrated circuit 1022 through the selector 1005, and a second probe 1030 is placed adjacent the integrated circuit 1022. This second probe 1030 is connected to another input of the multiplexer 1010. The multiplexer 1010 and the selector 1005 are controlled by a controller 1032. A second shield 1026 may be placed over the second integrated circuit 1022.

Having the amplifier 1014 in the probe circuit reduces sensitivity to noise and reduces the effects of system capacitance. Alternatively, the amplifier could be located inside the detector 1018 or an amplifier could be placed between each of the probes and the multiplexer 1010.

Another technique to reduce noise when testing an integrated circuit using the method of the present invention, is to guard all ground and power pins of the integrated circuit. This technique is particularly effective since this usually grounds the printed circuit board ground plane which is also connected to many pins on other integrated circuits, thus reducing overall system noise.

Although the circuits described above are shown testing an electrical component such as an integrated circuit, the technique will work equally well with mechanical components such as integrated circuit sockets. It will also work with analog electrical components or discrete components such as resistors and capacitors.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A method for testing a component on a circuit assembly to determine whether the component is conductively connected to a circuit on the circuit assembly, said method comprising the steps of:

placing a conductive electrode in proximity with a surface of the component;

measuring a capacitance between said conductive electrode and the circuit; and indicating a fault if said capacitance is outside a predetermined range of capacitance values.

2. A system for testing a component to determine whether a terminal pin of the component is conductively connected to a trace of a printed circuit assembly, said system comprising:

signal means for supplying a time varying electrical current, said signal means having a signal output element connected to the trace of the printed circuit assembly, and said signal means further having a common output element, wherein said signal means supplies said time varying electrical current to the trace through said signal output element and further wherein said time varying electrical current returns to said signal means through said common output element;

a conductive electrode having a surface in proximity with a surface of the component, said conductive electrode being connected to said common output element;

current measuring means connected to measure said time varying electrical current flowing through said trace to said conductive electrode and to said common output element; and means for indicating a fault when said current measured by said current measuring means is below a predetermined threshold.

3. The system of claim 2 wherein said conductive electrode is of a size to couple substantially to only the terminal pin.

4. The system of claim 2 further comprising shielding means adjacent to a top of said conductive electrode for shielding said conductive electrode and connections thereto from unwanted electrical signals and noise, wherein said shielding means is connected to said common output element.

5. The system of claim 2 further comprising amplification means connected between said conductive electrode and said current measuring means.

6. The system of claim 2 further comprising means for connecting a voltage plane of said printed circuit assembly to said common output element.

7. A system for testing a component to determine whether a terminal pin of the component is conductively connected to a trace of a printed circuit assembly, said system comprising:

a conductive electrode having a surface in proximity with a surface of the component;

signal means for supplying a time varying electrical current, said signal means having a signal output element connected to said conductive electrode, and said signal means further having a common output element, wherein said signal means supplies said time varying electrical current to said conductive electrode through said signal output element and further wherein said time varying electrical current returns to said signal means through said common output element connected to the trace;

means for connecting a voltage plane of said printed circuit assembly to said common output element;

current measuring means connected to measure an amount of said time varying electrical current conducted through the trace;

current amplification means connected between the trace and said current measuring means; and means for indicating a fault when said current measured by said current measuring means is below a predetermined threshold.

8. A system for testing a component to determine whether one of a plurality of terminal pins of the component is conductively connected to a trace of a printed circuit assembly, said system comprising:

signal means for supplying a time varying electrical voltage to the trace, said signal means having a signal output element connected to the trace, and said signal means further having a common output element, wherein said signal means supplies said time varying electrical voltage to the trace through said signal output element and further wherein said common output element provides a return path for any current that flows is a result of said time varying electrical voltage;

a conductive electrode having a surface in proximity with a surface of the component, said conductive electrode being connected to said common output element; and capacitance measuring means connected to measure a capacitance between said conductive electrode and said one of said plurality of terminal pins and-for indicating a fault when said measured capacitance is below a predetermined threshold.

9. The system of claim 8 further comprising amplification means connected between said conductive electrode and said capacitance measuring means.

10. The system of claim 8 wherein said conductive electrode is of a size to couple substantially to said one of said plurality of terminal pins.

11. The system of claim 8 wherein said conductive electrode further comprises:

a plurality of segments wherein each of said segments couples substantially to a single one of said plurality of terminal pins of said component;

a selector having an output connected to said capacitance measuring means and having a plurality of inputs, one connected to each of said plurality of segments; and means for selecting one of said plurality of inputs.

12. The system of claim 8 further comprising means for connecting at least one of said plurality of terminal pins of said component to said common output element, wherein said at least one terminal pin is not connected to the trace.

13. The system of claim 8 wherein said common output element is further connected to a voltage plane within said printed circuit assembly.

14. A system for testing a component to determine whether a terminal pin of the component is conductively connected to a trace of a printed circuit assembly, said system comprising:

a conductive electrode having a surface in proximity with a surface of the component;

signal means for supplying a time varying electrical current, said signal means having a signal output element connected to said conductive electrode, and said signal means further having a common output element, wherein said signal means supplies said time varying electrical current to said conductive electrode through said signal output element and further wherein said time varying electrical current returns to said signal means through said common output element connected to the trace;

means for connecting a voltage plane of said printed circuit assembly to said common output element; and current measuring means connected to measure an amount of said time varying electrical current conducted through the trace; and means for indicating a fault when said current measured by said current measuring means is below a predetermined threshold.

15. A method for testing a component to determine whether one of a plurality of terminal pins of the component is conductively connected to a circuit, said method comprising the steps of:

(a) placing a conductive electrode in proximity with a surface of the component;

(b) connecting a signal source to the circuit to supply a time varying electrical current to the circuit;

(c) measuring electrical current being conducted to said conductive electrode;

(d) indicating an error condition if said current is outside a predetermined range of values.

16. The method of claim 15 wherein step (a) further comprises the step of placing said conductive electrode in an abutting relationship to said component.

17. The method of claim 15 wherein step (b) further comprises the step of:

(b1) grounding at least one of the plurality of terminal pins of the component, wherein said at least one of the plurality of terminal pins is not connected to the circuit.

18. The method of claim 15 wherein step (a) further comprises the step of:

(a1) placing a grounded electrical shield around said conductive electrode to reduce unwanted electrical signals and noise coupling to said conductive electrode.

19. The method of claim 15 wherein step (c) further comprises the step of:

(c1) amplifying said current from said conductive electrode prior to said measuring.

20. A system for testing a plurality of components to determine whether each of a plurality of terminal pins of each of the components is conductively connected to one of a plurality of traces of a circuit assembly, said system comprising:

signal means for supplying an electrical signal, said signal means having a signal output element, and said signal means having a common output element, wherein said signal means supplies said electrical signal through said signal output element and further wherein said common output element provides a return path for said electrical signal;

selector means having an input connected to said signal output element, and having a plurality of outputs, one connected to each of said plurality of traces;

a plurality of conductive electrodes each having a surface in proximity with a surface of one of said plurality of components;

multiplexer means having a plurality of inputs, one of said inputs being connected to each of said plurality of conductive electrodes;

capacitance measuring means connected between an output of said multiplexer means and said common signal output element; and controller means having an output connected to said selector means for selecting one of said plurality of outputs, and having an output connected to said multiplexer means to select one of said plurality of inputs of said multiplexer means, which allows said capacitance measuring means to measure a capacitance between said conductive electrode and each of said traces connected to said one of said plurality of terminal pins and for indicating a fault when a measured capacitance is below a predetermined threshold.

21. The system of claim 20 further comprising:

amplification means connected between said multiplexer means and said capacitance measuring means.

22. The system of claim 20 further comprising:

a plurality of amplification means, one of said plurality of amplification means connected between each of said plurality of conductive electrodes and a corresponding one of said inputs of said multiplexer means.

23. The system of claim 20 wherein said capacitance measuring means further comprises amplification means connected to amplify a signal from said multiplexer means.

24. A system for testing a component to determine whether one of a plurality of terminal pins of the component is conductively connected to a trace of a printed circuit assembly, said system comprising:

a conductive electrode having a surface in proximity with a surface of the component, wherein said conductive electrode couples substantially to a single one of the plurality of terminal pins;

signal means for supplying a time varying electrical current, said signal means having a signal output element connected to said conductive electrode, and said signal means further having a common output element, wherein said signal means supplies said time varying electrical current through said signal output element and further wherein said time varying electrical current returns to said signal means through said common output element connected to the trace;

current measuring means connected to measure an amount of said time varying electrical current conducted through the trace; and means for indicating a fault when said current measured by said current measuring means is below a predetermined threshold.

25. A system for testing a component to determine whether a terminal pin of the component is conductively connected to a trace of a printed circuit assembly, said system comprising:

a conductive electrode having a surface in proximity with a surface of the component;

signal means for supplying a time varying electrical current, said signal means having a signal output element connected to said conductive electrode, and said signal means further having a common output element, wherein said signal means supplies said time varying electrical current to the trace through said signal output element and further wherein said time varying electrical current returns to said signal means through said common output element connected to the trace;

shielding means adjacent to a top of said conductive electrode for shielding said conductive electrode and connections thereto from unwanted electrical signals and noise, wherein said shielding means is connected to said common output element;

current measuring means connected to measure an amount of said time varying electrical current that is conducted through said conductive electrode; and means for indicating a fault when said current measured by said current measuring means is below a predetermined threshold.

* * * * *